US011362042B2

(12) United States Patent
Muthuseenu et al.

(10) Patent No.: US 11,362,042 B2
(45) Date of Patent: Jun. 14, 2022

(54) SEMICONDUCTOR DEVICE WITH OXIDE-NITRIDE STACK

(71) Applicant: Icemos Technology Corporation, Tempe, AZ (US)

(72) Inventors: Kiraneswar Muthuseenu, Tempe, AZ (US); Samuel Anderson, Tempe, AZ (US); Takeshi Ishiguro, Fukushima (JP)

(73) Assignee: IceMos Technology Corporation, Tempe, AZ (US)

( * ) Notice: Subject to any disclaimer, the term of this patent is extended or adjusted under 35 U.S.C. 154(b) by 97 days.

(21) Appl. No.: 16/752,054

(22) Filed: Jan. 24, 2020

(65) Prior Publication Data

US 2021/0233864 A1    Jul. 29, 2021

(51) Int. Cl.
*H01L 23/552* (2006.01)
*H01L 29/06* (2006.01)
*H01L 21/8234* (2006.01)
*H01L 21/762* (2006.01)
*H01L 29/51* (2006.01)
*H01L 23/556* (2006.01)

(52) U.S. Cl.
CPC ...... *H01L 23/552* (2013.01); *H01L 21/76224* (2013.01); *H01L 21/823462* (2013.01); *H01L 21/823481* (2013.01); *H01L 23/556* (2013.01); *H01L 29/0653* (2013.01); *H01L 29/518* (2013.01)

(58) Field of Classification Search
CPC ............... H01L 23/552; H01L 23/556; H01L 21/76224; H01L 21/823481; H01L 29/0653; H01L 29/518
See application file for complete search history.

(56) References Cited

U.S. PATENT DOCUMENTS

| 6,410,958 B1 * | 6/2002 | Usui | H01L 29/0634 |
| | | | 257/329 |
| 7,723,172 B2 | 5/2010 | Ishiguro | |
| 8,580,651 B2 | 11/2013 | Ishiguro | |
| (Continued) | | | |

OTHER PUBLICATIONS

Raparla et al., "A model of radiation effects in nitride-oxidie films for the MOSFET applications", Solid-State Electronics, vol. 47, Issue 5, pp. 775-783, May 2003.

*Primary Examiner* — Feifei Yeung Lopez
(74) *Attorney, Agent, or Firm* — Robert D. Atkins; Patent Law Group: Atkins and Associates, P.C.

(57) ABSTRACT

A semiconductor device includes a semiconductor layer with opposing first and second main surfaces and a first column extending from the first main surface and having a first concentration of a dopant of the first conductivity type. A trench with a sidewall and bottom extends at least partially through the semiconductor layer from the first main surface. A second column between the trench sidewall and the first column has a second concentration of a dopant of a second conductivity type and is formed in the semiconductor layer and extends from the first main surface. A trench oxide layer is in contact with at least the trench sidewall and the trench bottom. A trench nitride layer covers the trench oxide layer at least on the trench sidewall. A dielectric seal material seals the trench proximate the first main surface of the semiconductor layer such that the trench is air-tight.

28 Claims, 17 Drawing Sheets

(56) References Cited

U.S. PATENT DOCUMENTS

| | | |
|---|---|---|
| 8,736,019 B2 | 5/2014 | Anderson et al. |
| 8,963,239 B2 | 2/2015 | Anderson et al. |
| 9,147,751 B2 | 9/2015 | Anderson et al. |
| 9,461,109 B1 | 10/2016 | Ishiguro et al. |
| 2002/0167046 A1* | 11/2002 | Aoki ................ H01L 21/28202 257/330 |
| 2003/0234423 A1* | 12/2003 | Bui .................... H01L 29/0634 257/341 |
| 2005/0181564 A1* | 8/2005 | Hshieh ............... H01L 29/0634 438/270 |
| 2007/0023830 A1* | 2/2007 | Pfirsch ............... H01L 29/7804 257/341 |
| 2014/0346593 A1* | 11/2014 | Hsieh ................ H01L 29/66734 257/334 |

* cited by examiner

SEMICONDUCTOR DEVICE WITH OXIDE-NITRIDE STACK

BACKGROUND OF THE INVENTION

Embodiments of the present invention relate generally to semiconductor devices and their methods of manufacture, and more particularly, to semiconductor devices having oxide-nitride stacked layers within and around trenches and other structures to provide protection against radiation damage.

When semiconductor devices, such as power metal-oxide-semiconductor field-effect transistors (MOSFETs), are utilized in the upper atmosphere or in space (e.g., on rockets, satellites, space stations, or the like), they must maintain reliability despite the presence of potentially damaging cosmic rays. This is also true in other environments where the semiconductor device may be subjected to radiation doses above and beyond typical working conditions. The most sensitive parts of these semiconductor devices tend to be the oxide layers and the silicon-oxide interfaces.

One previous solution for increasing reliability includes providing thicker oxide layers. This reduces the radiation-induced electric field and makes the device able to withstand a Single Event Effect (SEE). However, the thicker oxide makes the overall device weaker when considering the effects from a Total Ionizing Dose (TID). FIG. 1 shows the effect on threshold voltage and threshold leakage current in a power MOSFET structure for increasing radiation exposure. Oxide trapped charges and interface trap density increase as the total radiation exposure goes up, driving the threshold voltage lower and increasing the threshold leakage current.

It is therefore desirable to provide a semiconductor device which is able to avoid the increases in oxide trapped charges and interface trap density due to radiation exposure.

BRIEF SUMMARY OF THE INVENTION

Briefly stated, an embodiment of the present invention comprises a semiconductor device including a semiconductor layer with opposing first and second main surfaces and including a first column extending from the first main surface and having a first concentration of a dopant of the first conductivity type. A trench extends at least partially through the semiconductor layer from the first main surface. The trench has a sidewall and a bottom. A second column has a second concentration of a dopant of a second conductivity type opposite the first conductivity type and is formed in the semiconductor layer and extends from the first main surface. The second column is disposed between the trench sidewall and the first column. A trench oxide layer is in contact with at least the sidewall and the bottom of the trench. A trench nitride layer covers the trench oxide layer at least on the sidewall of the trench. A dielectric seal material seals the trench proximate the first main surface of the semiconductor layer such that the trench is air-tight.

In one aspect, the semiconductor device further includes a source/drain region formed at the first main surface of the semiconductor layer and having a third concentration of the dopant of the first conductivity type. The third concentration is higher than the first concentration.

In another aspect, the semiconductor device further includes a gate oxide layer formed over at least a portion of the first main surface of the semiconductor layer, a gate nitride layer formed on at least a portion of the gate oxide layer, and a gate electrode formed on at least a portion of the gate nitride layer.

In another aspect, the semiconductor device further includes a body contact region formed at the first main surface of the semiconductor layer and adjacent the trench sidewall and having a fourth concentration of the dopant of the second conductivity type. The fourth concentration is higher than the second concentration. A body region is formed at the first main surface of the semiconductor layer and adjacent the trench sidewall and surrounds the source/drain region and the body contact region. The body region has a fifth concentration of the dopant of the second conductivity type.

In another aspect, the semiconductor device further includes an inter-dielectric oxide layer formed over the gate electrode, wherein the trench nitride layer extends over the inter-dielectric oxide layer.

In another aspect, the trench nitride layer further covers the trench oxide layer on the bottom of the trench and/or extends over a portion of the first main surface of the semiconductor layer surrounding the trench.

In another aspect, the trench contains a gas or is sealed under a vacuum.

Another embodiment of the present invention comprises a method of manufacturing a semiconductor device. The method includes providing a semiconductor layer with opposing first and second main surfaces and having a first concentration of a dopant of a first conductivity type, forming a trench at least partially through the semiconductor layer from the first main surface, the trench having a sidewall and a bottom, and forming first and second columns extending from the first main surface in the semiconductor layer. The first column has the first concentration of the dopant of the first conductivity type, the second column has a second concentration of a dopant of a second conductivity type opposite the first conductivity type, and is disposed between the trench sidewall and the first column. The method further includes forming a trench oxide layer over the first main surface of the semiconductor layer, and the sidewall and the bottom of the trench, forming a trench nitride layer over at least a portion of the trench oxide layer, and bonding an oxide wafer to at least one of the trench nitride layer or the trench oxide layer proximate the first main surface of the semiconductor layer, thereby sealing the trench.

In one aspect, the method further includes exposing a portion of the first main surface of the semiconductor layer, and forming a source/drain region at the first main surface of the semiconductor layer. The source/drain region has a third concentration of the dopant of the first conductivity type. The third concentration is higher than the first concentration.

In another aspect, the method further includes forming a gate oxide layer over the exposed portion of the first main surface of the semiconductor layer, forming a gate nitride layer over at least a portion of the gate oxide layer, and forming a gate electrode over at least a portion of the gate nitride layer.

In another aspect the method further includes forming a body contact region at the first main surface of the semiconductor layer and adjacent the trench sidewall and having a fourth concentration of the dopant of the second conductivity type. The fourth concentration is higher than the second concentration. The method additionally includes forming a body region at the first main surface of the semiconductor layer and adjacent the trench sidewall and surrounding the source/drain region and the body contact region. The body region has a fifth concentration of the dopant of the second conductivity type.

In another aspect, the method further includes coupling a source/drain electrode to the source/drain region.

In another aspect, the method further includes removing the trench nitride layer from over the trench oxide layer on the bottom of the trench and over the first main surface of the semiconductor layer prior to bonding the oxide layer to the trench oxide layer.

Yet another embodiment of the present invention comprises a method of manufacturing a semiconductor device. The method includes providing a semiconductor layer with opposing first and second main surfaces and having a first concentration of a dopant of a first conductivity type, and forming a source/drain region at the first main surface of the semiconductor layer. The source/drain region has a second concentration of the dopant of the first conductivity type, the second concentration being higher than the first concentration. The method further includes forming a gate oxide layer over the first main surface of the semiconductor layer, forming a gate nitride layer over at least a portion of the gate oxide layer, forming a gate electrode over at least a portion of the gate nitride layer, forming an inter-dielectric oxide layer over the gate oxide layer, gate nitride layer, and gate electrode, and forming a trench through the inter-dielectric oxide layer and the gate oxide layer and at least partially through the semiconductor layer from the first main surface. The trench has a sidewall and a bottom. The method further includes forming first and second columns extending from the first main surface in the semiconductor layer. The first column has the first concentration of the dopant of the first conductivity type, the second column has a third concentration of a dopant of a second conductivity type opposite the first conductivity type, and is disposed between the trench sidewall and the first column. The method further includes forming a trench oxide layer over the inter-dielectric oxide layer, and the sidewall and the bottom of the trench, forming a trench nitride layer over at least a portion of the trench oxide layer, and bonding an oxide wafer to at least one of the trench nitride layer or the trench oxide layer proximate the inter-dielectric oxide layer, thereby sealing the trench.

In one aspect, the method further includes forming a body contact region at the first main surface of the semiconductor layer and having a fourth concentration of the dopant of the second conductivity type. The fourth concentration is higher than the third concentration. The method further includes forming a body region at the first main surface of the semiconductor layer and surrounding the source/drain region and the body contact region. The body region has a fifth concentration of the dopant of the second conductivity type. The trench is formed with its sidewall adjacent to the body contact region and the body region.

In another aspect, the method further includes coupling a source/drain electrode to the source/drain region.

In another aspect, the method further includes removing the trench nitride layer from over the trench oxide layer on the bottom of the trench and over the first main surface of the semiconductor layer prior to bonding the oxide layer to the trench oxide layer.

BRIEF DESCRIPTION OF THE SEVERAL VIEWS OF THE DRAWINGS

The following detailed description of preferred embodiments of the invention will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
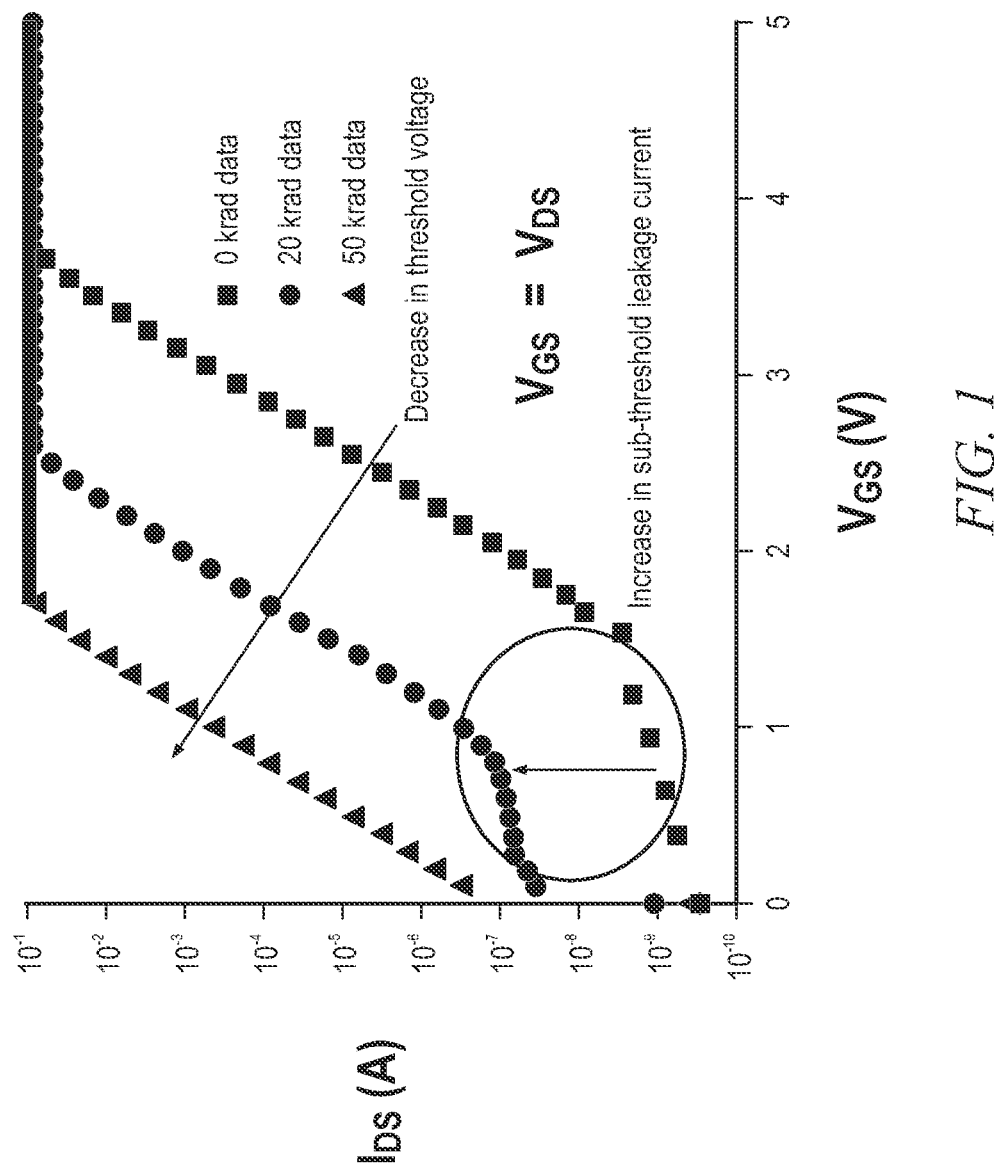
FIG. 1 is a plot of threshold voltage and threshold leakage current in power MOSFET structures for various levels of radiation exposure.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one." Unless stated otherwise, terms such as "first" and "second" are used to arbitrarily distinguish between the elements such terms describe. Thus, these terms are not necessarily intended to indicate temporal or other prioritization of such elements.

It should also be understood that the terms "about," "approximately," "generally," "substantially" and like terms, used herein when referring to a dimension or characteristic of a component of the invention, indicate that the described dimension/characteristic is not a strict boundary or parameter and does not exclude minor variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping concentration terms should not be construed as limiting.

Figure 2:
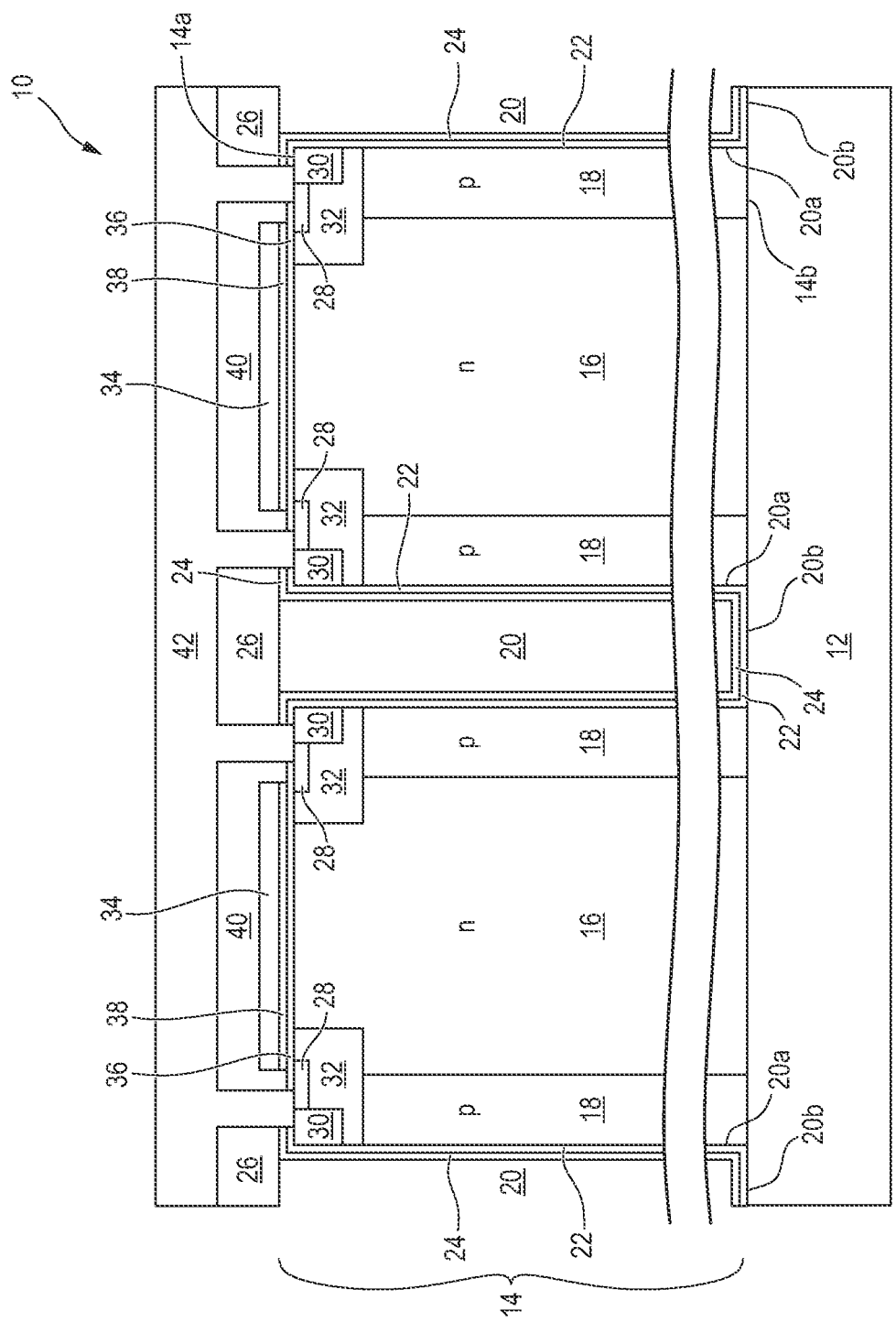
FIG. 2 is an enlarged partial cross-sectional elevational view of a semiconductor device in accordance with a first embodiment of the present invention.

Referring to FIG. 2, there is shown an enlarged, partial cross-sectional, elevational view of a semiconductor device 10 in accordance with a first exemplary embodiment of the present invention. The device 10 preferably includes a semiconductor substrate 12 and a semiconductor layer 14 having opposed first and second main surfaces 14a, 14b, with the second main surface 14b of the semiconductor layer 14 being coupled to a surface of the semiconductor substrate 12. The semiconductor layer 14 may include a plurality of alternating n and p columns 16, 18 that extend at least partially from the first main surface 14a toward the semiconductor substrate 12.

At least one, and preferably more, trenches 20 are formed to extend at least partially through the semiconductor layer 14 from the first main surface 14a thereof. Each trench 20 includes a sidewall 20a and a bottom 20b. In the embodiment shown in FIG. 2, the trench 20 extends entirely through the semiconductor layer 14 such that the bottom 20b is formed by a surface of the semiconductor substrate 12. However, the invention is not so limited. The trench 20 may only extend partially through the semiconductor layer 14, in which case a portion of the semiconductor layer 14 would form the bottom 20b of the trench 20. In still other embodiments, the trench 20 may extend through the semiconductor layer 14 and partially into the semiconductor substrate 12, for example. In the example shown in FIG. 2, one of the p columns 18 is disposed between the trench 20 and a nearby n column 16, although other arrangements of device components in the semiconductor layer 14 may be utilized as well. For example, the p column 18 may extend to a shorter depth than the trench 20 such that the trench sidewall 20a may also be in contact with an n-doped portion of the semiconductor layer 14.

A trench oxide layer 22 is preferably in contact with at least the sidewall 20a and the bottom 20b of the trench 20. In the embodiment of FIG. 2, the trench oxide layer 22 is also shown contacting a portion of the first main surface 14a of the semiconductor layer 14 surrounding the trench 20A trench nitride layer 24 further preferably covers the trench oxide layer 22 at least on the sidewall 20a of the trench 20, although in FIG. 2 the trench nitride layer 24 is also shown covering the trench oxide layer 22 at the bottom 20b of the trench 20 and extending over a portion of the first main surface 14a of the semiconductor layer 14 surrounding the trench 20. Although not required, the trench nitride layer 24 preferably overlies the entire trench oxide layer 22, thereby protecting any interface between the trench oxide layer 22 and semiconductor material in the device 10. Although not required, a thin oxide layer (not shown) may be formed over the trench nitride layer 24 in some embodiments.

A dielectric seal material 26 preferably seals the trench 20 proximate to the first main surface 14a of the semiconductor layer 14 such that the trench 20 is air-tight. The dielectric seal material 26 is shown in the embodiment of FIG. 2 as being formed outside of the trench 20 and in contact with the trench nitride layer 24 (or any layers formed thereover, such as a thin oxide layer). However, in some embodiments, the dielectric seal material 26 may partially extend into the trench 20 to provide the seal. It is preferred that except for the trench lining, the trench 20 remain largely unfilled. Preferably, processing takes place in air, or one or more other gases (such as inert gases or the like), or can be performed in a vacuum. Thus, the trench 20 may contain one or more gases, such as inert gases or air. Preferred inert gases include nitrogen and argon. In a preferred embodiment, a sealed trench 20 includes ambient air. It is preferred that moisture content be kept low in such embodiments. The trench 20 may be sealed at atmospheric pressure or below. In some other embodiments, the trench 20 may be sealed under vacuum.

Highly doped (e.g., $n^+$) regions serving as source/drain regions 28 may be formed at the first main surface 14a of the semiconductor layer 14. Similarly, highly doped (e.g., $p^+$) regions serving as body contact regions 30 may be formed at the first main surface 14a of the semiconductor layer 14 adjacent the sidewall 20a of the trench 20 (preferably between the source/drain region 28 and the trench 20). A body region 32 (such as a p doped region) may be formed at the first main surface 14a of the semiconductor layer 14 and adjacent the sidewall 20a of the trench 20, preferably surrounding the source/drain region 28 and the body contact region 30. As shown in the embodiment of FIG. 2, the trench oxide and trench nitride layers 22, 24 preferably overlap a portion of the body contact region 30 at the first main surface 14a of the semiconductor layer 14.

A gate electrode 34 may be provided spaced apart from the first main surface 14a of the semiconductor layer 14. For example, a gate oxide layer 36 may be formed over at least a portion of the first main surface 14a of the semiconductor layer 14 between adjacent trenches 20. Preferably, a gate nitride layer 38 is formed over at least a portion of the gate oxide layer 36. The gate electrode 34 is then formed on at least a portion of the gate nitride layer 38 (although a thin oxide layer (not shown) may be deposited on the gate nitride layer 38 before formation of the gate electrode 34). An inter-dielectric oxide layer 40 may be formed over the gate electrode 34. A metal source/drain electrode 42 preferably connects with the source/drain region 28.

FIGS. 3-9 generally show various steps of manufacturing the semiconductor device 10 shown in FIG. 2.

Figure 3:
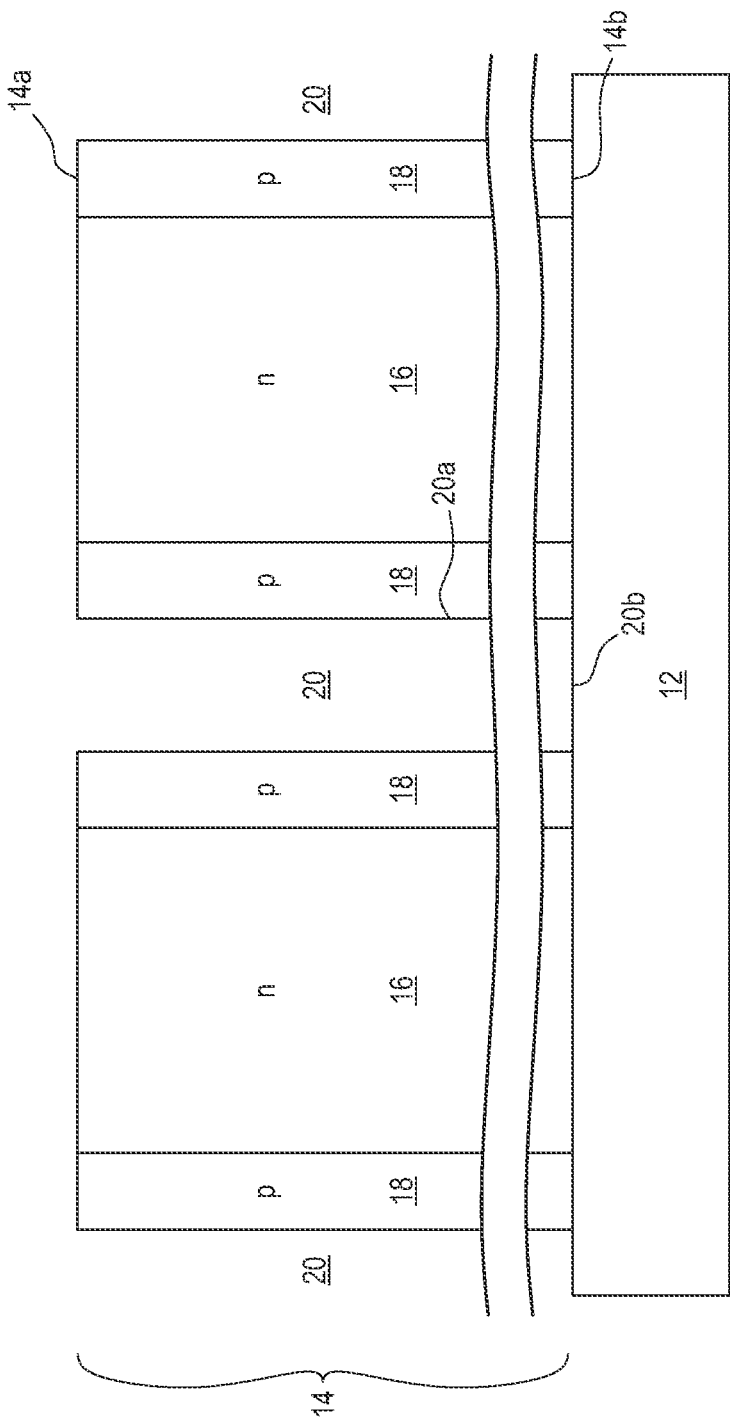
FIG. 3 is an enlarged partial cross-sectional elevational view of a semiconductor substrate and a semiconductor layer in accordance with the first embodiment.

Referring to FIG. 3, the semiconductor substrate 12 is preferably formed of silicon (Si). But, the semiconductor substrate 12 may be formed of other materials such as gallium arsenide (GaAs), germanium (Ge), or the like. The semiconductor substrate 12 preferably is of the heavily doped $n^+$ type.

The semiconductor layer 14 is formed such that the second main surface 14b is disposed on the semiconductor substrate 12. In some embodiments, the semiconductor layer 14 may be epitaxially grown on a surface of the semiconductor substrate 12 and may be a lightly doped $n^-$ or intrinsically n doped silicon layer. The epitaxial growth or deposition may occur in a suitable reaction chamber at a temperature of up to about 1200° C. to a desired thickness. Other methods for forming the semiconductor layer 14 on the semiconductor substrate 12, such as by bonding, annealing, and the like, may be used.

The trenches 20 are formed in the first main surface 14a of the semiconductor layer 14. The trenches 20 are preferably etched using deep reactive ion etching (DRIE). DRIE utilizes an ionized gas, or plasma, such as, for example, sulfur hexafluoride ($SF_6$), to remove material from the semiconductor layer 14. DRIE technology permits deeper trenches 20 with straighter sidewalls. Other techniques for forming the trenches 18 can be used, however, such as plasma etching, reactive ion etching (RIE), sputter etching, vapor phase etching, chemical etching, or the like.

A mask (not shown) is selectively applied over the main surface 14a of the semiconductor layer 14. The mask may be created by deposition of a layer of photoresist or in some other manner well known to those skilled in the art. The developed photoresist is removed, and undeveloped photoresist remains in place as is known in the art. For simplification, the mask refers to the material used to prevent certain areas of a semiconductor from being etched, doped, coated or the like. In certain embodiments, a thin layer of oxide or other dielectric material (not shown) may be applied to the first main surface 14a prior to formation of the mask. The trenches 20 are formed in the areas not covered by the mask. After the trenching process, the mask is removed using techniques known in the art.

The sidewalls 20a of each trench 20 can be smoothed, if needed, using, for example, one or more of the following process steps: (i) an isotropic plasma etch may be used to remove a thin layer of silicon (typically 100-1000 Angstroms) from the trench 20 surfaces or (ii) a sacrificial silicon dioxide layer may be grown on the surfaces of the trench 20 and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

If necessary, the sidewalls 20a of the trenches 20 are implanted or doped with an n-type dopant, which may occur at predetermined angles, to form the n columns 16. The implantation angles are determined by the width of the trenches 20 and the desired doping depth, and are typically from about 2° to 12° (−2° to −12°) from vertical. The implant is done at angles so that the bottom 20b of each trench 20 is not implanted. Preferably, the implantation occurs at least partially, and preferably entirely, between the first main surface 14a and the semiconductor substrate 12. The implant is performed at an energy level of about 30-200 kilo-electron-Volts (KeV) with dose ranges from about 1E13 to 1E14 cm$^{-2}$ (i.e., about $1\times10^{13}$ to $1\times10^{14}$ cm$^{-2}$). Consequently, a dopant of the first conductivity type (e.g., n-type) is implanted into the semiconductor layer 14 to form doped regions of the first conductivity type having a doping concentration lower than that of the heavily doped semiconductor substrate 12. The doping may occur with the aid of a mask (not shown) placed over the first main surface 14a of the semiconductor layer 14.

The doping may be performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized, such as antimony Sb, bismuth Bi, aluminum Al, indium In, gallium Ga or the like depending on the material and the desired strength of the doping. Preferably, the doping is performed by ion implantation.

Following implanting, a drive-in step at a temperature of up to 1200° C. may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention. If the semiconductor layer 14 is already adequately doped for purposes of the resulting n column 16, then these steps may be omitted.

A similar doping step preferably occurs with respect to the sidewalls 20a of the trenches 20, but with a dopant of the opposite conductivity type (e.g., p-type), to form the p columns 18 that separate the n column 16 from the trench 20.

Figure 4:
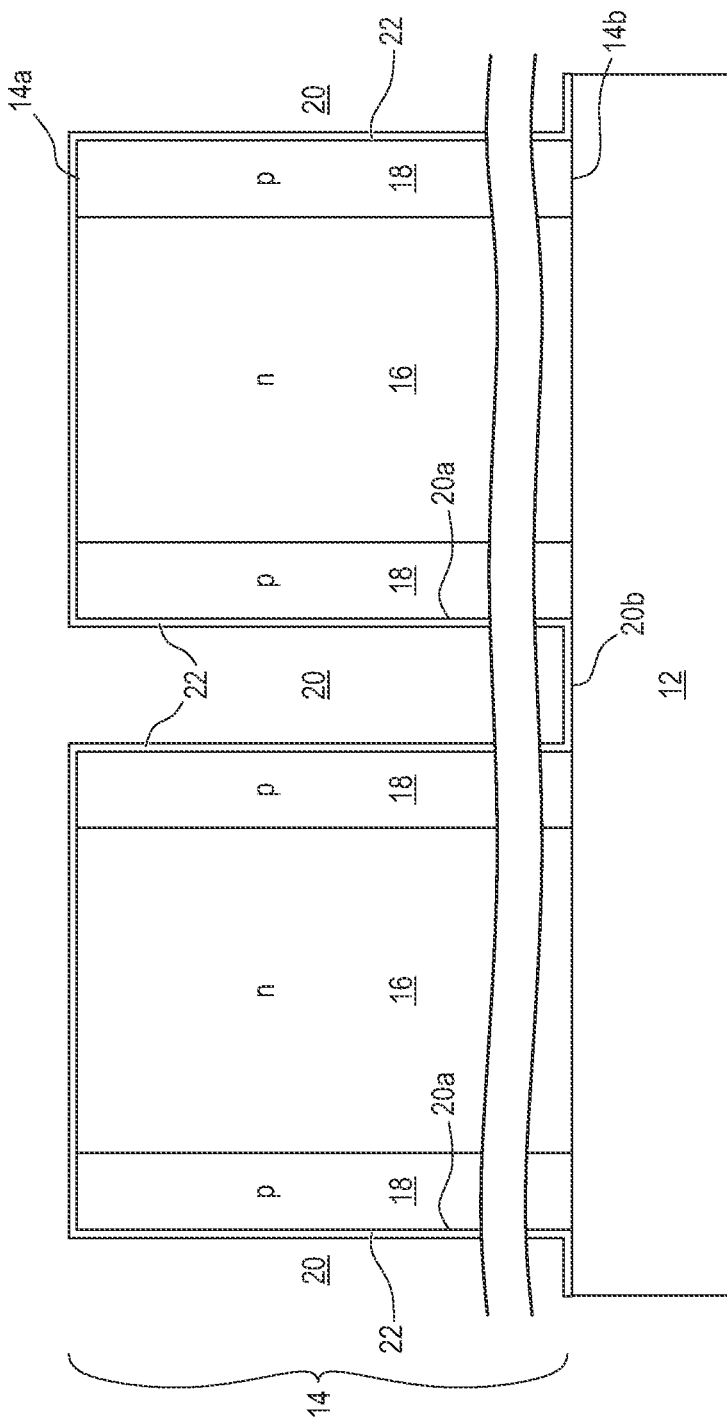
FIG. 4 is an enlarged partial cross-sectional elevational view of the device of FIG. 3 with a trench oxide layer formed thereon.

Referring to FIG. 4, the trench oxide layer 22 is preferably formed over the first main surface 14a of the semiconductor layer 14, as well as on the sidewalls 20a and bottoms 20b of the trenches 20. The trench oxide layer 22 may be formed using thermal growth, low pressure (LP) chemical vapor deposition (CVD), plasma enhanced chemical vapor deposition (PECVD), atmospheric pressure chemical vapor deposition (APCVD), deposition, or the like. Preferably, the trench oxide layer 22 has a thickness in the range of about 200 to about 5000 Angstroms.

Figure 5:
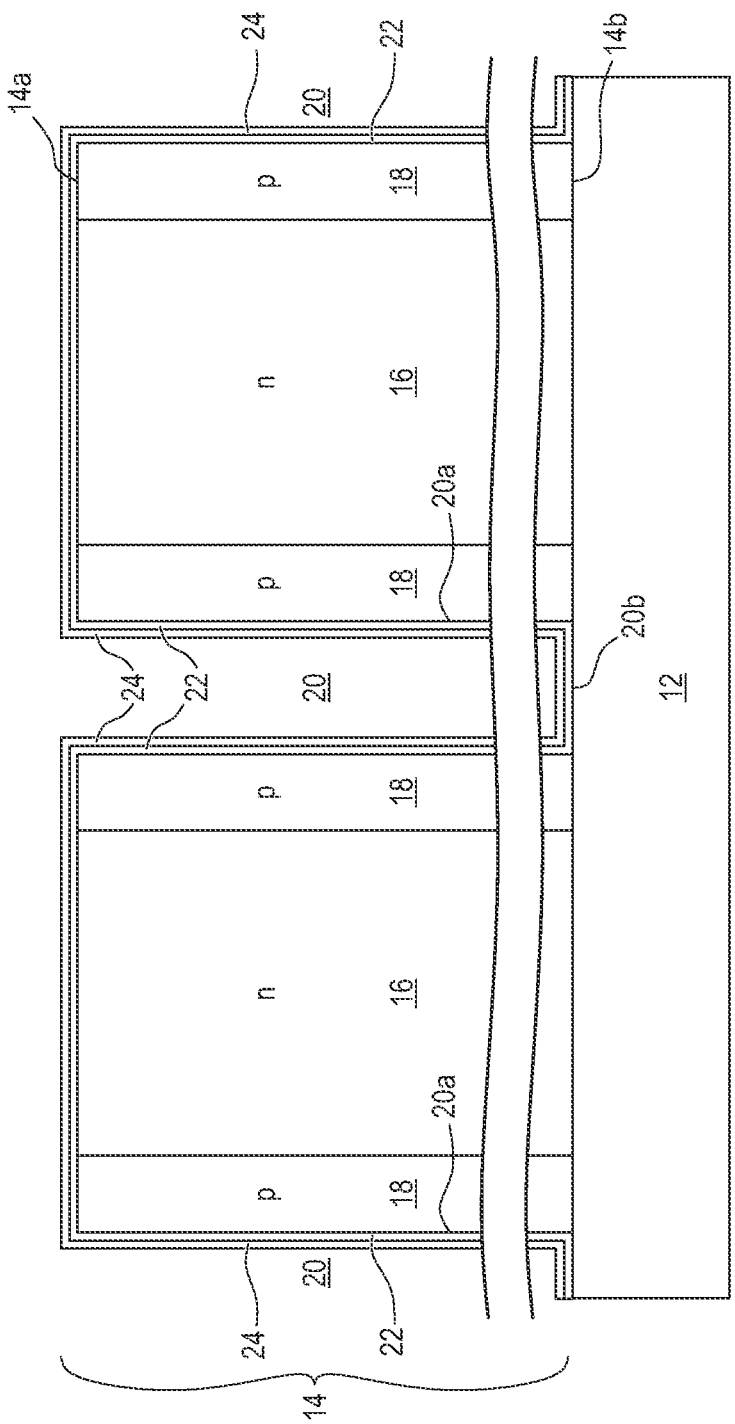
FIG. 5 is an enlarged partial cross-sectional elevational view of the device of FIG. 4 with a trench nitride layer formed thereon.

Referring to FIG. 5, the trench nitride layer 24 is preferably formed over at least a portion of the trench oxide layer 22. For example, the trench nitride layer 24 may be formed over the trench oxide layer 22 on the first main surface 14a of the semiconductor layer 14, and the sidewalls 20a and bottoms 20b of the trenches 20. The trench nitride layer 24 may be formed using thermal growth, LPCVD, PECVD, APCVD, deposition, or the like. Preferably, the trench nitride layer 24 has a thickness in the range of about 300 to about 2500 Angstroms.

Figure 16:
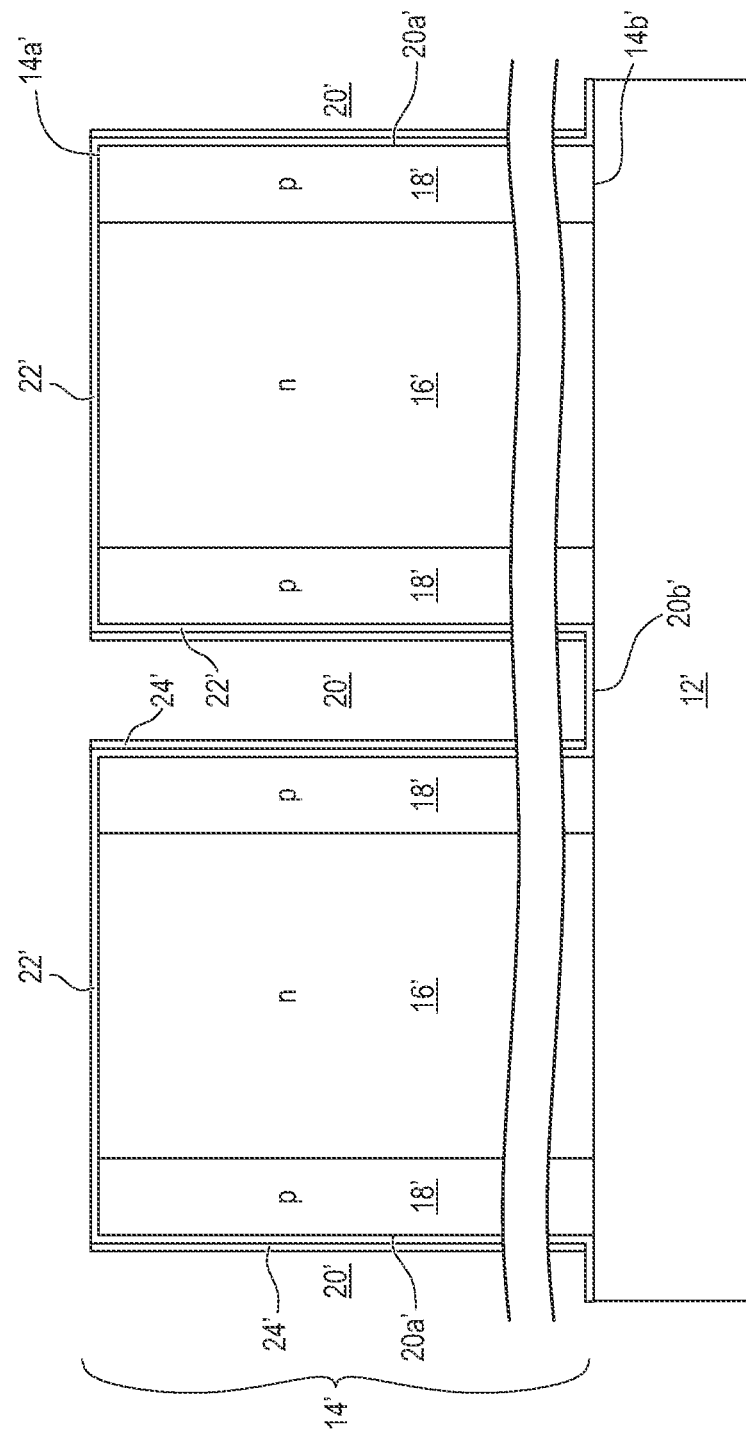
FIG. 16 is an enlarged partial cross-sectional elevational view of the device of FIG. 5 in an alternative embodiment where portions of the trench nitride layer are removed.

In an alternative embodiment, shown in FIG. 16, the trench nitride layer 24' may be removed via RIE or the like from the trench oxide layer 22' on the bottom 20b' of the trench 20' and over the first main surface 14a' of the semiconductor layer 14'. In this manner, the trench nitride layer 24' resides only on the trench oxide layer 22' lining the sidewall 20a' of the trench 20'. In another alternative, the relevant surfaces may be masked to such that the trench nitride layer is only grown in desired locations, such as the trench sidewall. Thus, the coverage of the trench oxide layer by the trench nitride layer is not limited to the embodiments shown.

Figure 6:
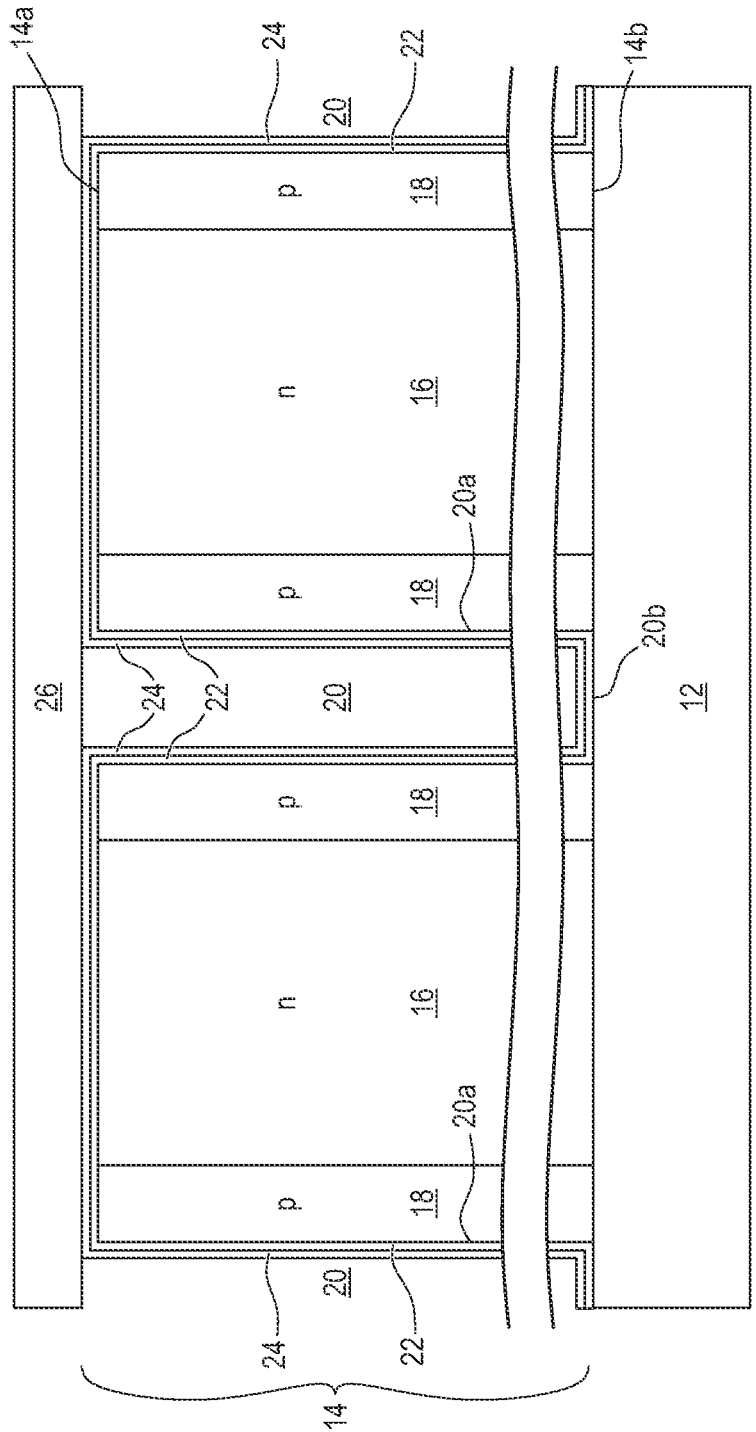
FIG. 6 is an enlarged partial cross-sectional elevational view of the device of FIG. 5 with an oxide wafer bonded thereto.

Referring to FIG. 6, the trenches 20 are sealed by the dielectric sealing material 26, which in this embodiment is shown as an oxide wafer that is bonded to the trench nitride layer 24 (which may be facilitated by attachment of the oxide wafer 26 to a thin oxide layer (not shown) formed over the trench nitride layer 24) proximate the first main surface 14a of the semiconductor layer 14. In embodiments where the trench oxide layer 22 is exposed through the trench nitride layer 24 near the first main surface 14a of the semiconductor layer 14 (see e.g., FIG. 16), the oxide wafer 26 may be bonded to the trench oxide layer 22 or both the trench oxide and nitride layers 22, 24, depending on the configuration. The oxide wafer 26 may be provided on a handle wafer (not shown). The bonding process may include heating the layers in an annealing furnace for a number of minutes or hours. For example, the partially fabricated device of FIG. 5 and the oxide wafer 26 may be placed in an annealing furnace at 800-1200° C. for few a minutes to several hours to cause the materials to sufficiently bond. The annealing process may be performed in an inert ambient atmosphere, e.g., nitrogen gas, or in an oxidizing ambient atmosphere, e.g., pure oxygen, oxygen/nitrogen mixture, steam or the like. During a "wet" anneal, i.e., when steam is the ambient, the steam is generated using a mixture of oxygen and hydrogen typically above 800° C. The handle wafer is subsequently removed, preferably through planarization using known techniques, such as chemical-mechanical polishing (CMP) or the like. The planarization can also be used to level and smooth the remaining oxide wafer 26, if necessary.

Figure 7:
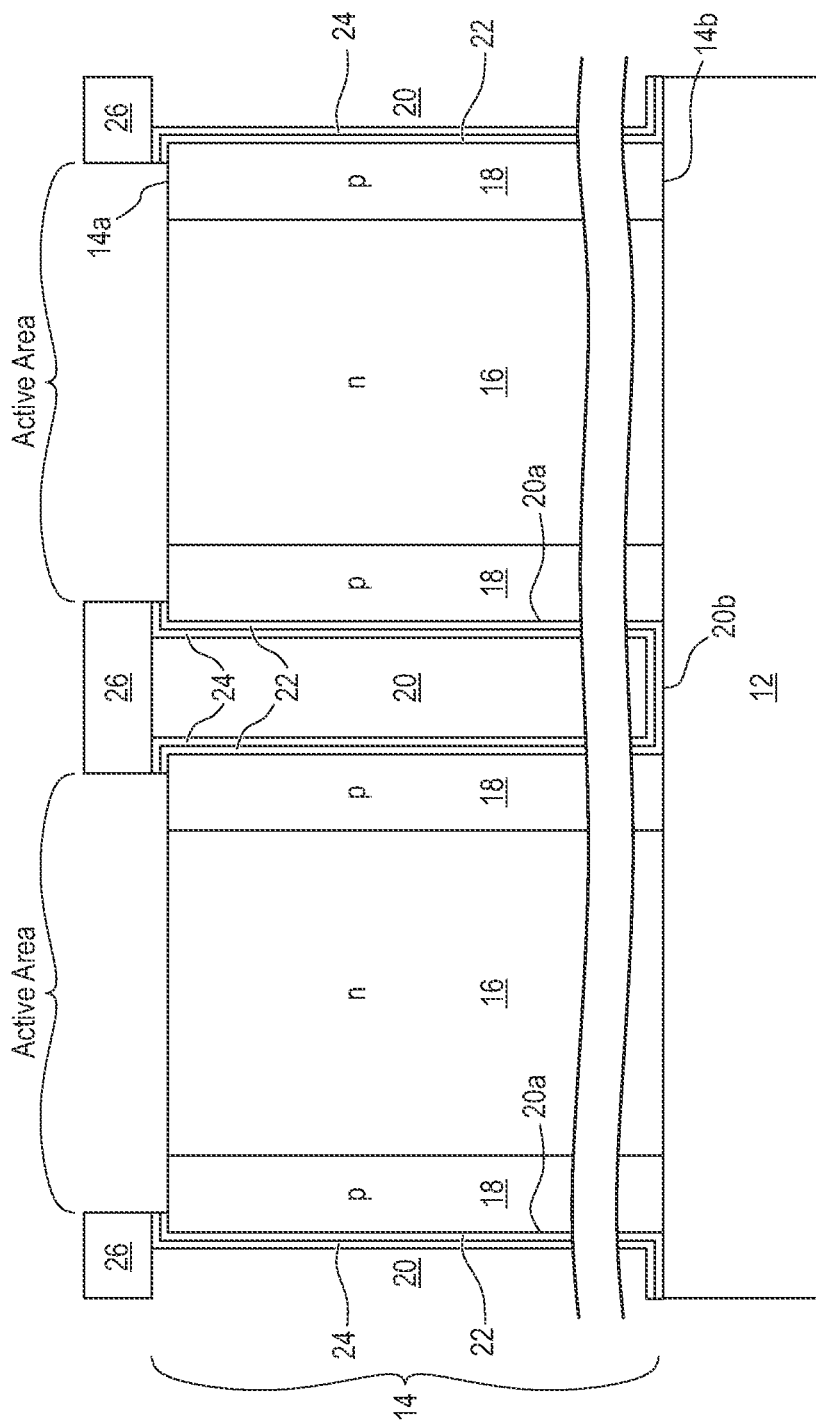
FIG. 7 is an enlarged partial cross-sectional elevational view of the device of FIG. 6 with portions of the dielectric materials on the first main surface removed.

Referring to FIG. 7, portions of the first main surface 14a of the semiconductor layer 14—regions which may be referred to as "active areas" in this embodiment—may be exposed by, for example, removing portions of the oxide wafer 26, as well as underlying portions of the trench nitride layer 24 and the trench oxide layer 22, where applicable. The layers 26, 24, 22 may be removed via chemical and/or mechanical etching techniques, polishing, grinding, or the like. Preferably, portions of the oxide wafer 26 covering and sealing the trenches 20 remain following the exposure of the active areas on the first main surface 14a of the semiconductor layer 14.

Figure 8:
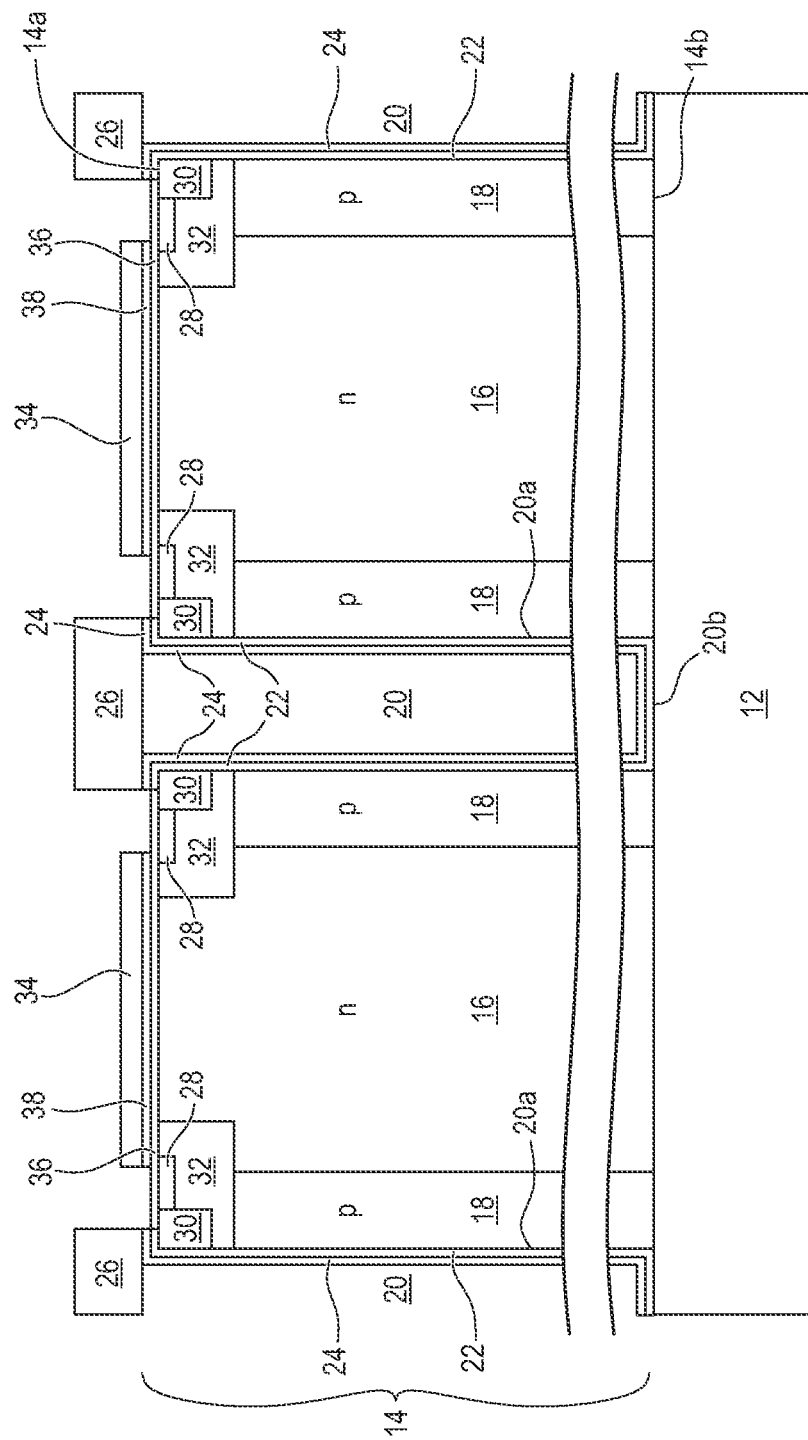
FIG. 8 is an enlarged partial cross-sectional elevational view of the device of FIG. 7 following formation of various MOSFET components thereon.

Referring to FIG. 8, device components may be formed in the active areas. For example, one or more body regions 32 proximate the first main surface 14a of the semiconductor layer 14 and adjacent the sidewalls 20a of the trenches 20 may be formed. The body regions 32 are preferably of p-type conductivity, having a dopant concentration suitable for forming inversion layers that operate as conduction channels of the device 10. In preferred embodiments, the body regions 32 are formed by depositing an oxide layer (not shown) over the first main surface 14a of the semiconductor layer 14, followed by the ion implantation of a p-type dopant (or n-type dopant) into the n and p columns 16, 18 through the oxide layer at an energy level of about 30-1000 KeV with a dose range from about $1\times10^{10}$ to $1\times10^{16}$ atoms $cm^{-2}$, preferably from about $1\times10^{14}$ to $1\times10^{16}$ atoms $cm^{-2}$, followed by a high temperature drive-in step (i.e., a diffusion). Other methods may be utilized as are known in the art. In addition, the body regions 32 can be formed at least partially by performing ion implantation of the sidewalls of the trenches 18. However, such a step would have to be performed prior to covering the trenches 20 with the dielectric sealing material 26, and preferably prior to formation of the trench oxide layer 22 and/or the trench nitride layer 24.

The source/drain regions 28 may also be formed proximate the first main surface 14a of the semiconductor layer 14 and within the body regions 32. The source/drain regions 28 are preferably a heavily doped $n^+$ type region, which may be formed using techniques similar to those described above for formation of the body regions 32. The orientation of the source/drain region 28 with respect to the body region 32 is not limited and can be varied depending upon the desired configuration of the device 10. Further, there is no limit to the order in which the two regions 28, 32 may be formed. Moreover, additional regions, such as a body-contact region 30 (preferably a heavily doped $p^+$ type region) adjacent the source/drain region 28 and within the body region 30, preferably also adjacent the sidewall 20a of the trench 20, may be formed according to the methods described above.

The gate oxide layer 36 may be formed over the active areas on the first main surface 14a of the semiconductor layer 14, and the gate nitride layer 38 may be formed over at least a portion of the gate oxide layer 36. The gate oxide and nitride layers 36, 38 may be formed according to the same techniques described above with respect to the trench oxide and nitride layers 22, 24. The gate electrode 34 is then formed over at least a portion of the gate nitride layer 38 and may be composed of, for example, a metal, a doped polysilicon, an amorphous silicon, or a combination thereof, and formed by conventional techniques.

It should be noted that while the drawings and description show the gate oxide layer 36, gate nitride layer 38, and gate electrode 34 being formed after the source/drain region 28, body-contact region 30, and body region 32, it is also possible to form the source/drain region 28 (or others) after the gate oxide layer 36, gate nitride layer 38, and gate electrode 34. Such an order can allow the source/drain region 28, for example, to self-align with the gate electrode 34. Accordingly, one skilled in the art will recognize that various steps described herein may be performed in different orders while achieving the same end result.

Figure 9:
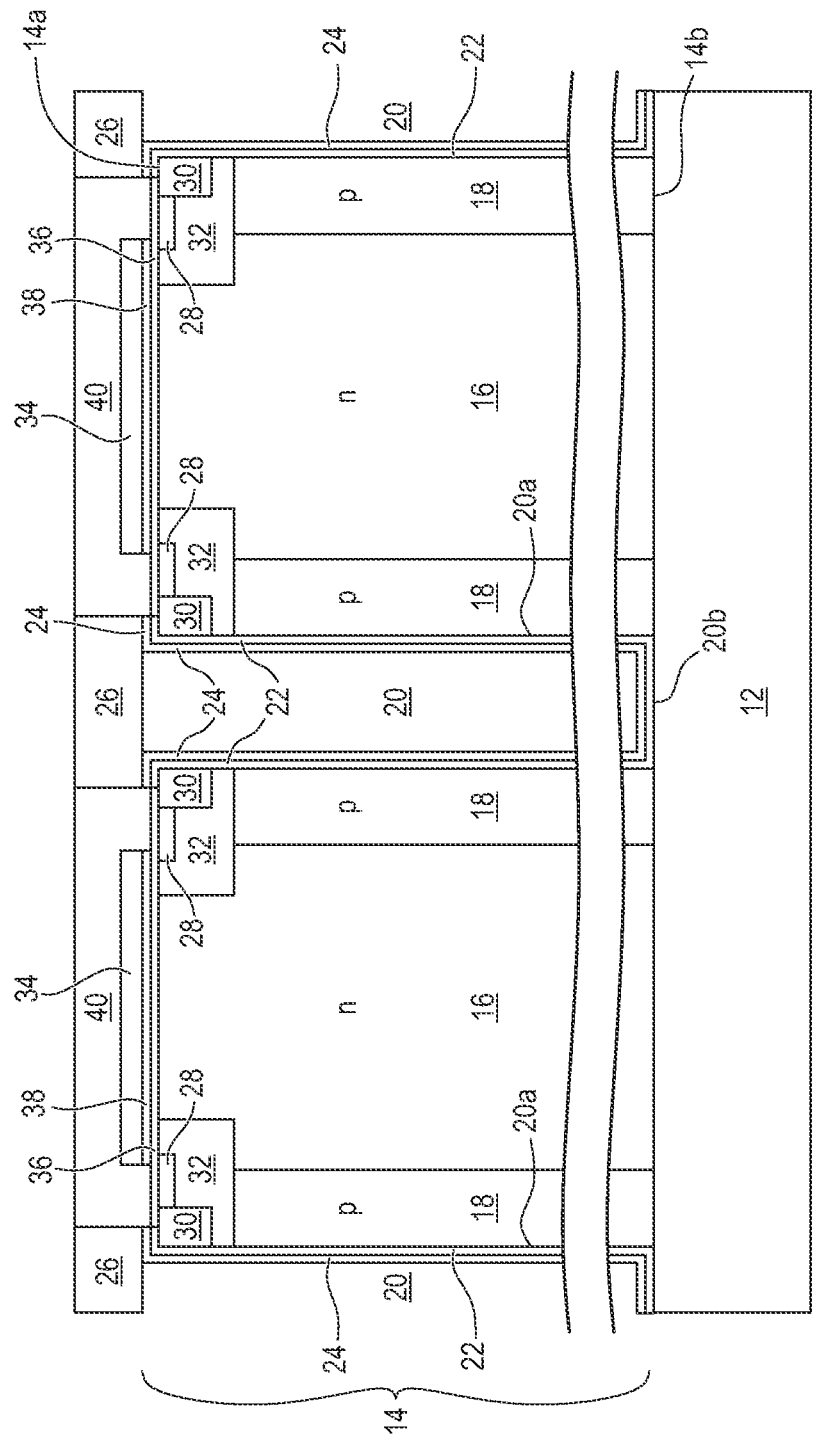
FIG. 9 is an enlarged partial cross-sectional elevational view of the device of FIG. 8 following formation of an inter-dielectric oxide layer.

Referring to FIG. 9, the inter-dielectric oxide layer 40 may be formed over the gate electrode 34, and preferably between the dielectric sealing materials 26 disposed over the trenches 20. The inter-dielectric oxide layer 40 may be formed according to dielectric layer formation techniques described above (e.g., thermal growth, LPCVD or the like). The inter-dielectric oxide layer 40 (and, if necessary, the intervening dielectric sealing materials 26) may further be planarized, using CMP or the like. Contact holes (FIG. 2) may be formed in the inter-dielectric oxide layer 40 using conventional oxide etching techniques. Using methods known in the field, metallization is performed to deposit a layer of metal 42, which serves as the source/drain electrode, over the contact hole openings, and the remaining inter-dielectric oxide layer 40 and dielectric sealing material 26, thereby coupling the source/drain electrode 42 to the source/drain region 28. Passivation is performed using methods known in the field with an appropriate passivation material such as nitride, oxide or phosphosilicate glass (PSG) to arrive at the device 10 shown in FIG. 2.

FIGS. 10-14 generally show various steps of manufacturing a semiconductor device 110 (FIG. 14) according to another embodiment. Like numerals have been used for like elements, except the 100 series numerals have been used for the embodiment shown in FIGS. 10-14. Accordingly, a complete description of the embodiment has been omitted, with only the differences being described.

Figure 10:
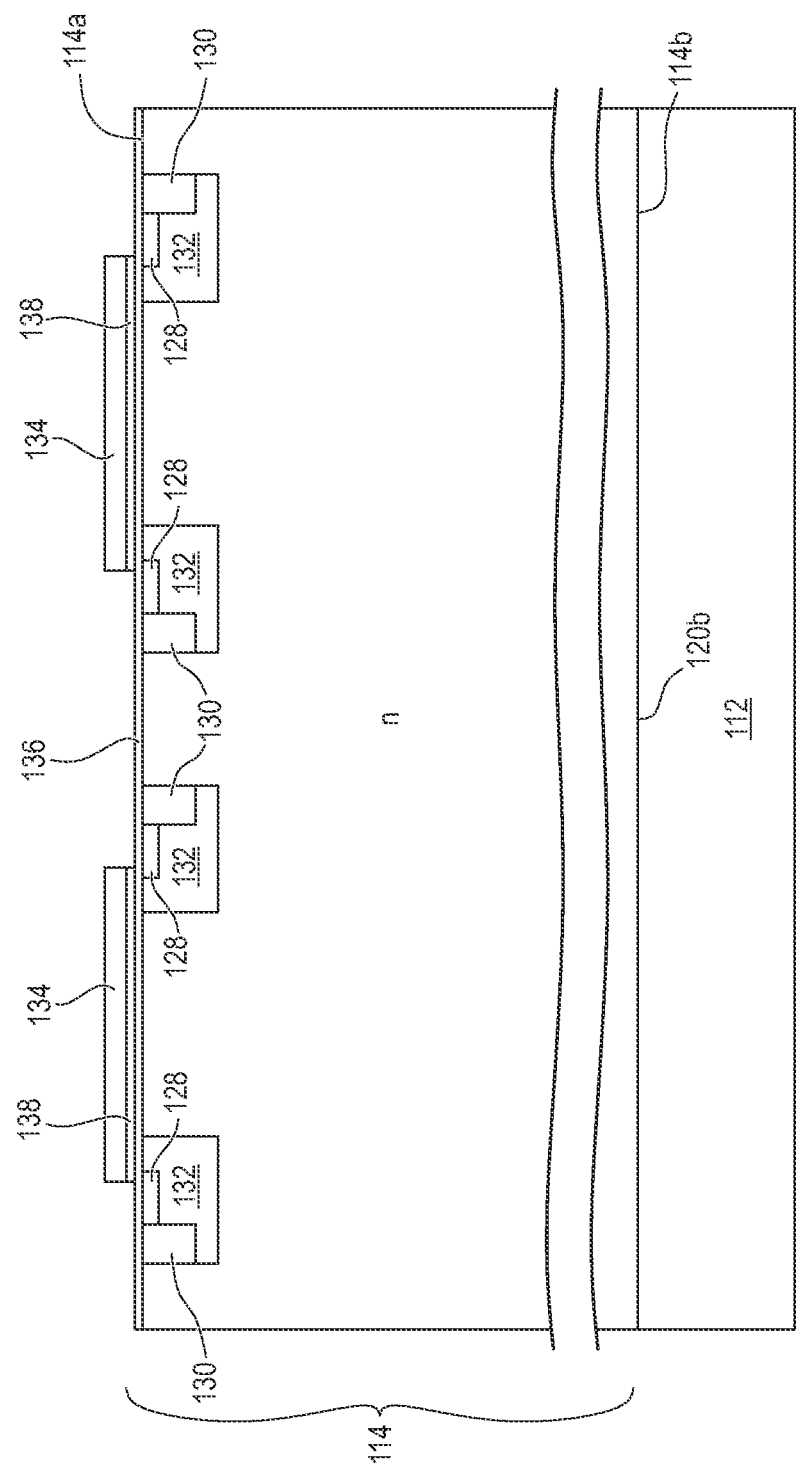
FIG. 10 is an enlarged partial cross-sectional elevational view of a semiconductor substrate and a semiconductor layer following formation of various MOSFET components in accordance with a second embodiment of the present invention.

Referring to FIG. 10, the semiconductor layer 114 is shown as an epitaxially grown n-type layer having its second main surface 114b disposed on the semiconductor substrate 112. The source/drain regions 128, body contact regions 130, and body regions 132 are all preferably formed at the first main surface 114a of the semiconductor layer 114, in a similar configuration to those shown in the embodiment of FIG. 2, although in this embodiment, doping would occur exclusively from the first main surface 114a since the trenches 120 have yet to be formed.

The gate oxide layer 136 is formed over the first main surface 114a of the semiconductor layer 114, and the gate nitride layer 138 is formed over at least a portion of the gate oxide layer 136, at least in the regions where the gate electrode(s) 134 are to be disposed. The gate electrode 134 is thereafter formed over at least a portion of the gate nitride layer 138. The inter-dielectric oxide 140 (not shown in FIG. 10) may then be formed over the gate oxide layer 136, gate nitride layer 138, and the gate electrode 134, and planarized as necessary.

Figure 11:
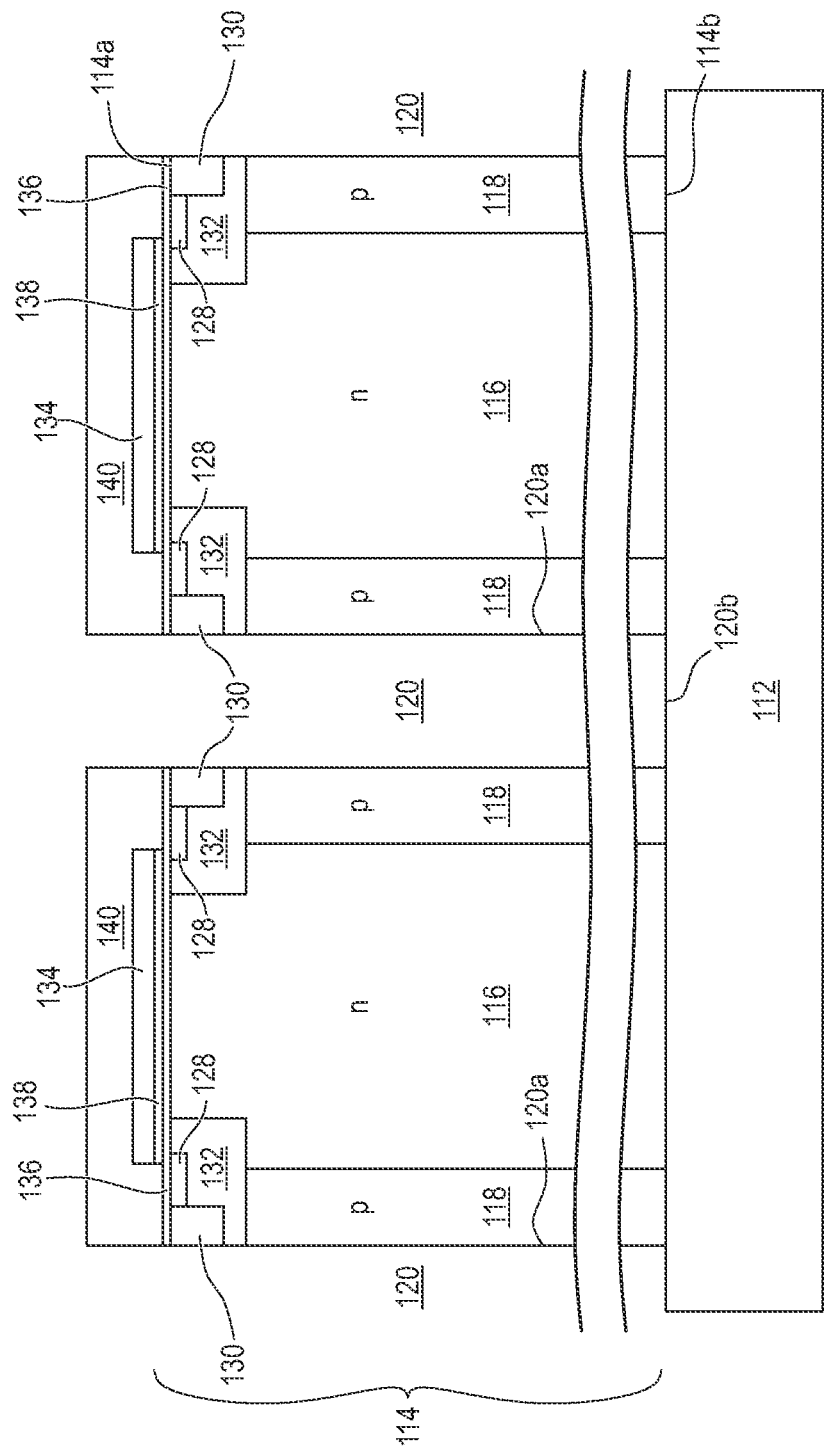
FIG. 11 is an enlarged partial cross-sectional elevational view of the device of FIG. 10 following formation of trenches and columns.

Referring to FIG. 11, the trenches 120 may be formed through the inter-dielectric oxide layer 140, the gate oxide layer 136, the gate nitride layer 138 if necessary, and at least partially through the semiconductor layer 114 from the first main surface 114a. The trenches 120 each have a sidewall 120a and a bottom 120b. The n and p columns 116, 118 are preferably thereafter formed through the techniques described above.

Figure 12:
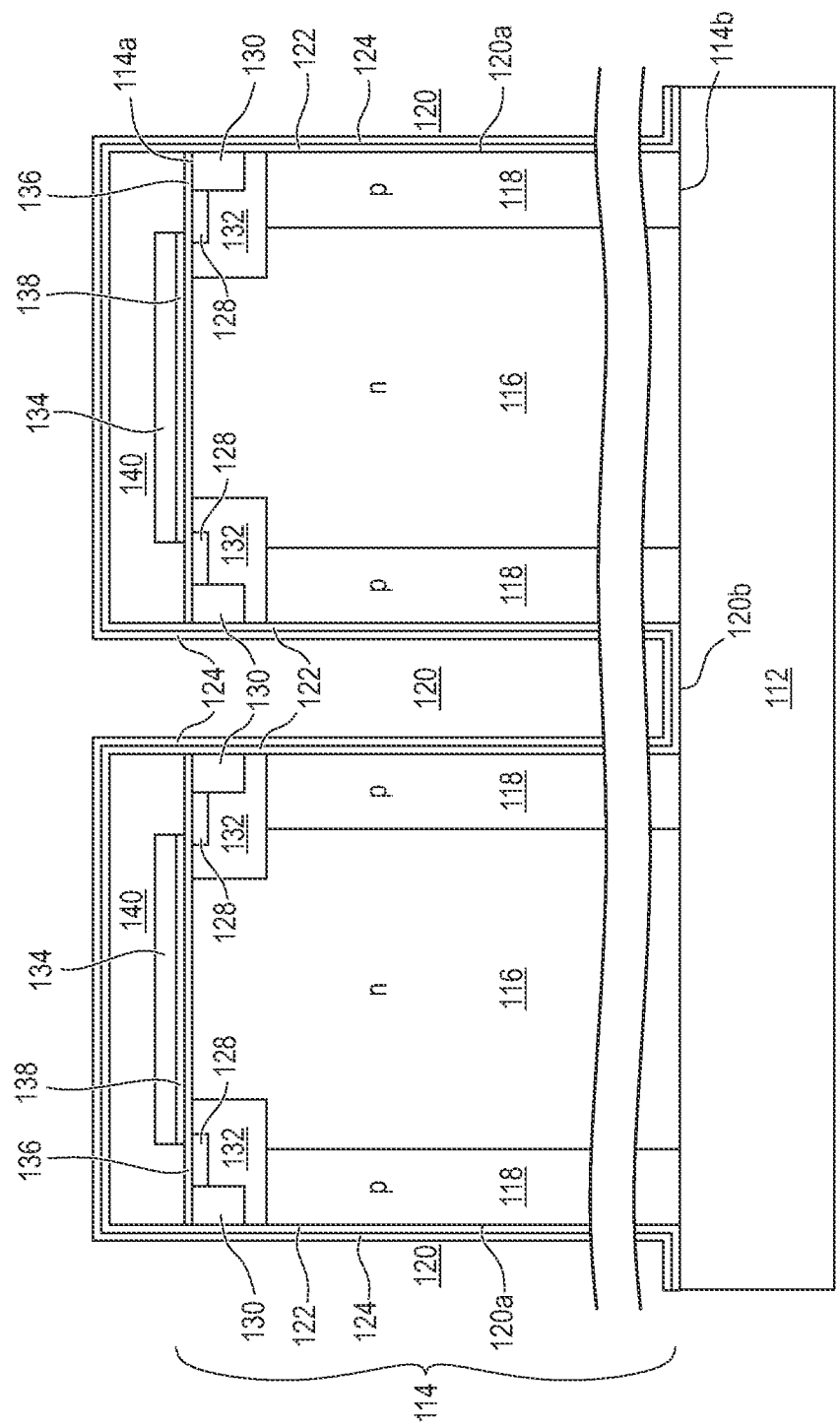
FIG. 12 is an enlarged partial cross-sectional elevational view of the device of FIG. 11 with trench oxide and nitride layers formed thereon.

Referring to FIG. 12, the trench oxide layer 122 may be formed over the sidewalls 120a and bottoms 120b of the trenches 120, as well as over the inter-dielectric oxide 140 overlying the first main surface 114a of the semiconductor layer 114. The trench nitride layer 124 is then preferably formed over at least a portion of the trench oxide layer 122. In the embodiment shown in FIG. 12, the trench nitride layer 124 covers the entire trench oxide layer 122, including portions overlying the sidewalls 120a and bottoms 120b of the trenches 120, as well as over the inter-dielectric oxide 140 overlying the first main surface 114a of the semiconductor layer 114. If necessary, a thin oxide deposition (not shown) may be applied to the trench nitride layer 124.

Figure 17:
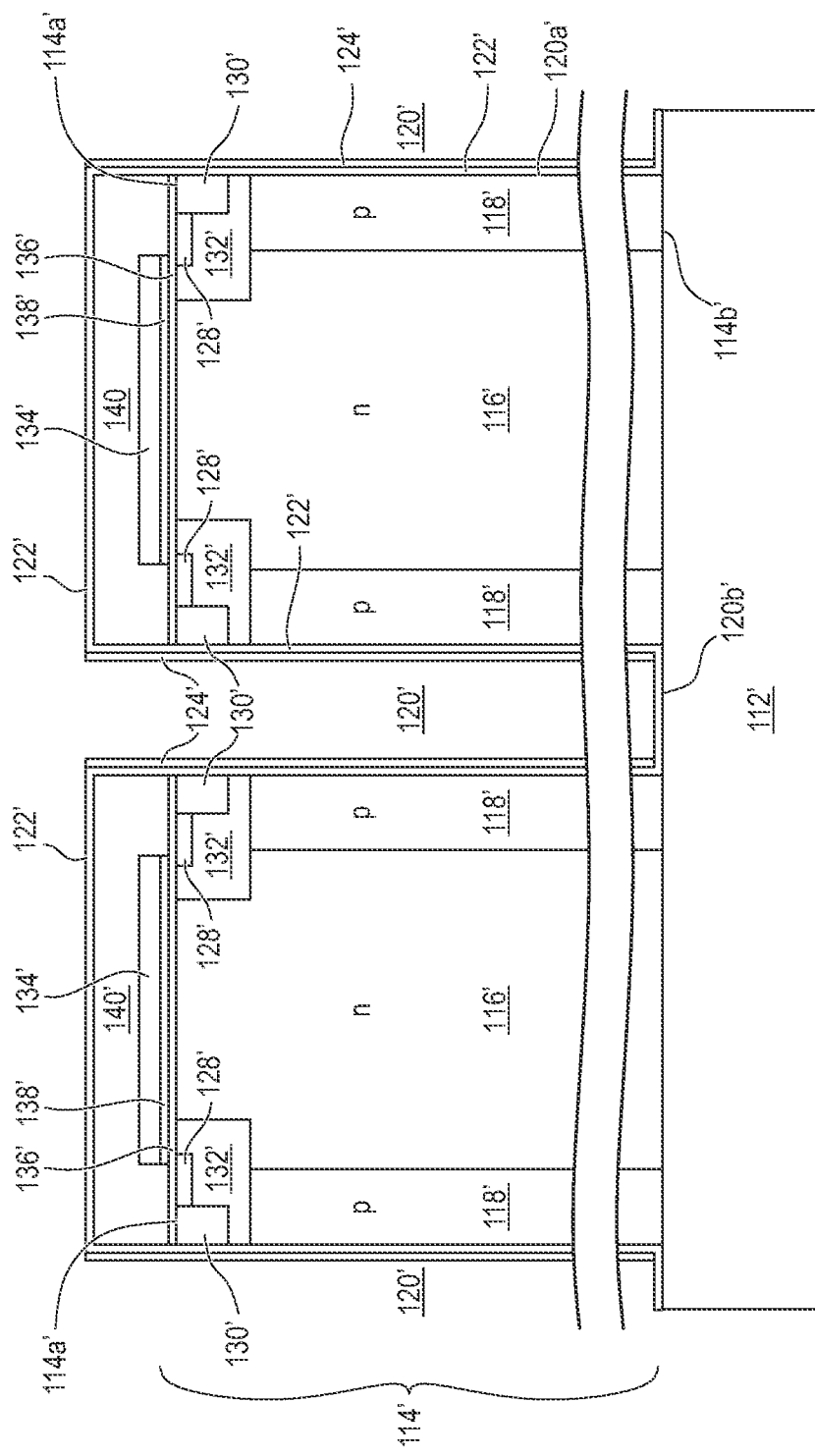
FIG. 17 is an enlarged partial cross-sectional elevational view of the device of FIG. 12 in an alternative embodiment where portions of the trench nitride layer are removed.

In an alternative embodiment, shown in FIG. 17, the trench nitride layer 124' may be removed via RIE or the like from the trench oxide layer 122' on the bottom 120b' of the trench 120' and over the inter-dielectric oxide layer 140' overlying the first main surface 114a' of the semiconductor layer 114'. In this manner, the trench nitride layer 124' resides only on the trench oxide layer 122' lining the sidewall 120a' of the trench 120'. In another alternative, the relevant surfaces may be masked to such that the trench nitride layer is only grown in desired locations, such as the trench sidewall. Thus, the coverage of the trench oxide layer by the trench nitride layer is not limited to the embodiments shown.

Figure 13:
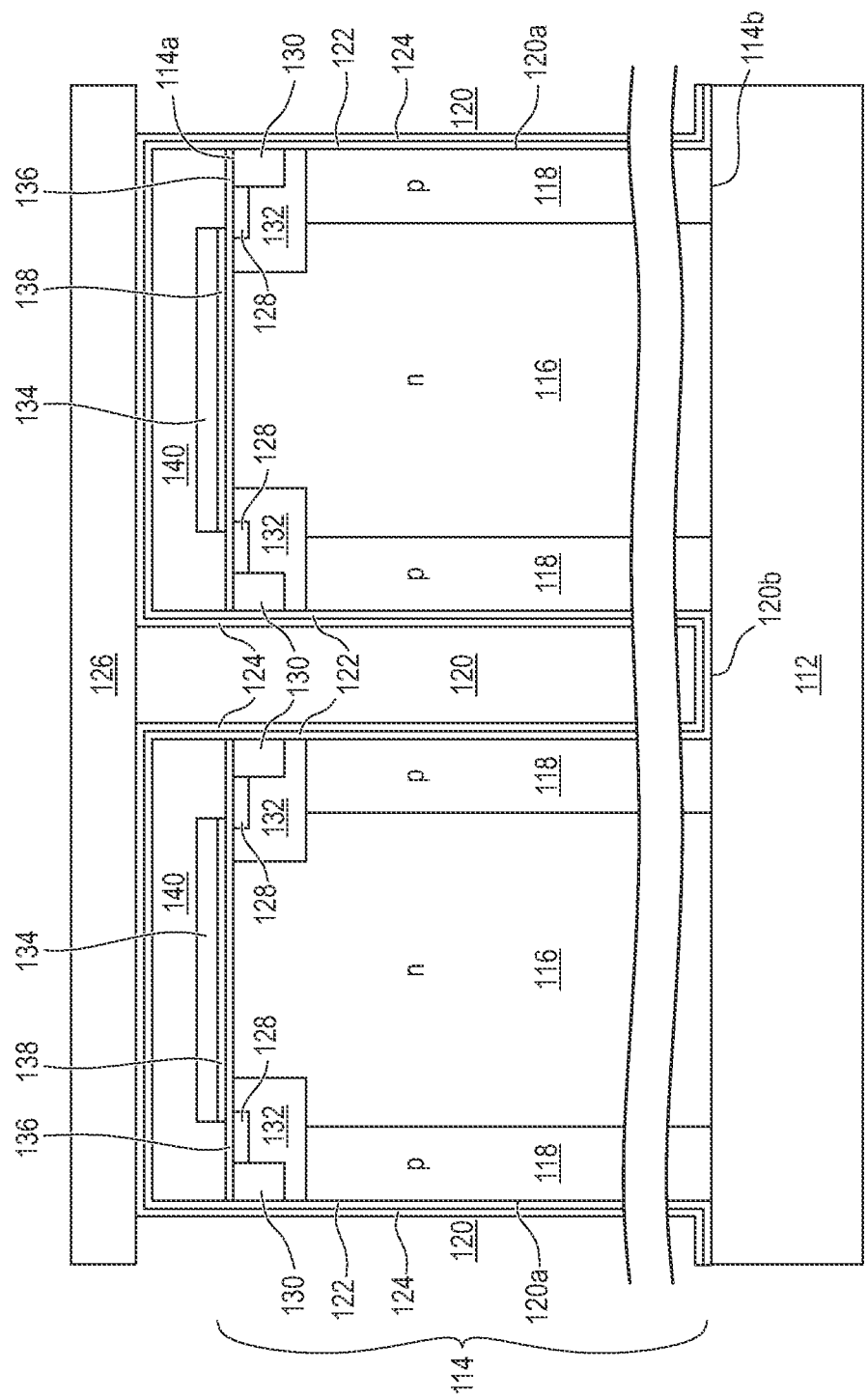
FIG. 13 is an enlarged partial cross-sectional elevational view of the device of FIG. 12 with an oxide wafer bonded thereto.

Referring to FIG. 13, the oxide wafer 126 may be bonded to the trench nitride layer 124 and/or trench oxide layer 122, as appropriate, proximate the inter-dielectric oxide layer 140, thereby sealing the trenches 120.

Figure 14:
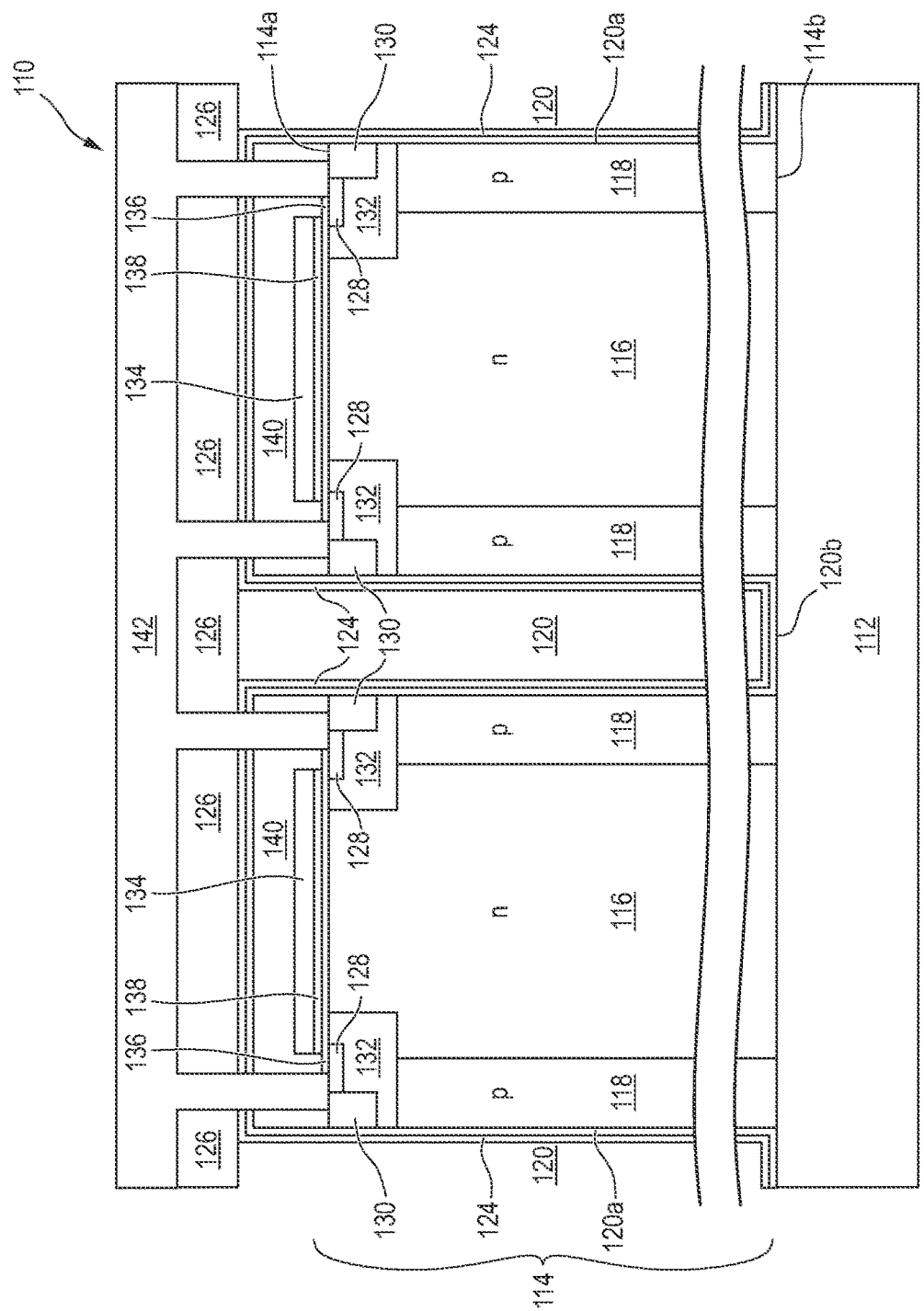
FIG. 14 is an enlarged partial cross-sectional elevational view of the device of FIG. 13 following source/drain electrode formation.

Referring to FIG. 14, the source/drain region 128 at the first main surface 114a of the semiconductor layer 114 may be exposed by forming contact holes that are preferably etched through the oxide wafer 126, the trench nitride layer 138, the trench oxide layer 136, and/or inter-dielectric oxide layer 140 (as well as any other intervening layers). The source/drain electrode 142 can then be coupled to the source/drain region 128 through the contact holes. Thus, one of the main differences of the device 110 from the second embodiment as compared to the device 10 from the first embodiment is that the trench oxide and nitride layers 122, 124 may extend over the gate electrode 134 in the second embodiment.

Figure 15:
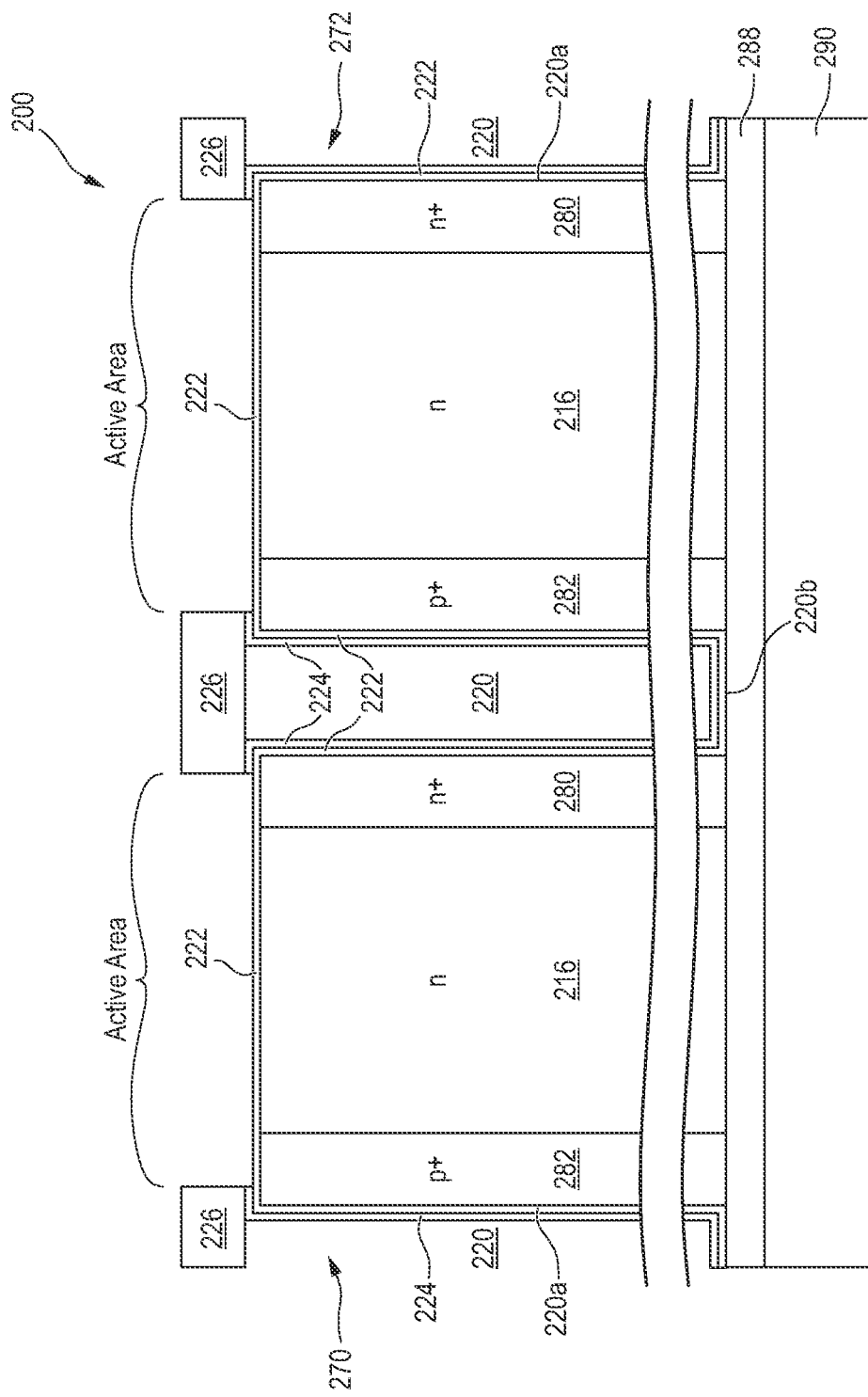
FIG. 15 is an enlarged partial cross-sectional elevational view of a semiconductor device in accordance with a third embodiment of the present invention.

Embodiments described herein can be applied to all types of semiconductor devices utilizing deep trenches, and are therefore not limited just to the types of power MOSFETs described above. For example, FIG. 15 shows an integrated circuit 200 having a plurality of sealed trenches 220 separating first and second semiconductor mesas 270, 272. The first semiconductor mesa 270 includes an n column 216 preferably separated from the adjacent trenches 220 by a heavily doped $n^+$ column 280 and a heavily doped $p^+$ column 282. The second semiconductor mesa 272 includes a p column 218 preferably separated from the adjacent trenches 220 by a heavily doped $n^+$ column 280 and a heavily doped $p^+$ column 282. The semiconductor mesas 270, 272 may be disposed on a buried oxide layer 288 formed on a support wafer 290. Sidewalls 220a and bottoms 220b of the trenches 220, as well as surfaces of the mesas 270, 272 opposite to the buried oxide layer 288 may be covered with a trench oxide layer 222. The trench oxide layer 222 on the sidewalls 220a and bottoms 220b of the trenches 220 is further preferably covered by a trench nitride layer 224, which may also extend partially over the surfaces of the mesas 270, 272 covered by the trench oxide layer 222, although it is preferred that active areas be left exposed between the trenches 220. The trenches 220 are preferably sealed by dielectric sealing material 226, as described above with respect to other embodiments. The integrated circuit 200 in FIG. 15 represents an exemplary additional use for the inventive concepts described herein.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

While specific and distinct embodiments have been shown in the drawings, various individual elements or combinations of elements from the different embodiments may be combined with one another while in keeping with the spirit and scope of the invention. Thus, an individual feature described herein only with respect to one embodiment should not be construed as being incompatible with other embodiments described herein or otherwise encompassed by the invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A semiconductor device, comprising:
    a semiconductor layer with opposing first and second main surfaces;
    a first trench extending at least partially through the semiconductor layer from the first main surface;
    a second trench extending at least partially through the semiconductor layer from the first main surface;

a first column of semiconductor material formed in the semiconductor layer between the first trench and second trench and extending from the first main surface;

a second column of semiconductor material formed in the semiconductor layer between the first trench and second trench and extending from the first main surface;

a trench oxide layer in contact with a sidewall of the first trench and a bottom of the first trench;

a trench nitride layer formed over the trench oxide layer on the sidewall of the first trench;

a dielectric seal material sealing the first trench proximate the first main surface of the semiconductor layer;

a gate oxide layer formed over a portion of the first main surface of the semiconductor layer;

a gate nitride layer formed on a portion of the gate oxide layer;

a gate electrode formed on a portion of the gate nitride layer; and an inter-dielectric oxide layer formed over the gate electrode, wherein the trench nitride layer extends over the inter-dielectric oxide layer.

2. The semiconductor device of claim 1, further comprising a source/drain region formed at the first main surface of the semiconductor layer.

3. The semiconductor device of claim 2, further comprising:
a body contact region formed at the first main surface of the semiconductor layer and adjacent to the sidewall of the first trench; and
a body region formed at the first main surface of the semiconductor layer and adjacent to the sidewall of the first trench and surrounding the source/drain region and the body contact region.

4. The semiconductor device of claim 1, wherein the trench nitride layer further covers the trench oxide layer on the bottom of the first trench.

5. The semiconductor device of claim 1, wherein the trench nitride layer extends over a portion of the first main surface of the semiconductor layer surrounding the first trench.

6. The semiconductor device of claim 1, wherein the first trench contains a gas or is sealed under vacuum.

7. A method of manufacturing a semiconductor device, comprising:
providing a semiconductor layer with opposing first and second main surfaces;
forming a first trench at least partially through the semiconductor layer from the first main surface;
forming a second trench at least partially through the semiconductor layer from the first main surface;
forming a first column of semiconductor material in the semiconductor layer between the first trench and second trench and extending from the first main surface;
forming a second column of semiconductor material in the semiconductor layer between the first trench and second trench and extending from the first main surface;
forming a trench oxide layer over the first main surface of the semiconductor layer, and the sidewall of the first trench and a bottom of the first trench;
forming a trench nitride layer on the sidewall of the first trench and over a portion of the trench oxide layer;
bonding an oxide wafer to at least one of the trench nitride layer or the trench oxide layer and over the first trench and second trench proximate the first main surface of the semiconductor layer as a sealing material;

forming a gate oxide layer over a portion of the first main surface of the semiconductor layer;
forming a gate nitride layer on a portion of the gate oxide layer;
forming a gate electrode on a portion of the gate nitride layer; and
forming an inter-dielectric oxide layer over the gate electrode, wherein the trench nitride layer extends over the inter-dielectric oxide layer.

8. The method of claim 7, further comprising:
exposing a portion of the first main surface of the semiconductor layer; and
forming a source/drain region at the first main surface of the semiconductor layer.

9. The method of claim 8, further comprising:
forming a body contact region at the first main surface of the semiconductor layer and adjacent to the sidewall of the first trench; and
forming a body region at the first main surface of the semiconductor layer and adjacent to the sidewall of the first trench and surrounding the source/drain region and the body contact region.

10. The method of claim 8, further comprising coupling a source/drain electrode to the source/drain region.

11. A semiconductor device, comprising:
a substrate;
a semiconductor layer disposed over the substrate;
a first trench extending at least partially through the semiconductor layer;
a second trench extending at least partially through the semiconductor layer;
a first column of semiconductor material formed in the semiconductor layer between the first trench and second trench;
a second column of semiconductor material formed in the semiconductor layer between the first trench and second trench;
a first insulating layer formed over a sidewall of the first trench;
a second insulating layer formed on the sidewall of the first trench and over the first insulating layer;
a sealing material disposed over the first trench and second trench;
a gate oxide layer formed over a portion of a surface of the semiconductor layer;
a gate nitride layer formed on a portion of the gate oxide layer;
a gate electrode formed on a portion of the gate nitride layer; and
an inter-dielectric oxide layer formed over the gate electrode, wherein the second insulating layer extends over the inter-dielectric oxide layer.

12. The semiconductor device of claim 11, wherein the first insulating layer includes an oxide layer.

13. The semiconductor device of claim 11, wherein the second insulating layer includes a nitride layer.

14. The semiconductor device of claim 11, further comprising an active semiconductor region formed at the surface of the semiconductor layer.

15. The semiconductor device of claim 11, wherein the first insulating layer extends over the surface of the semiconductor layer.

16. The semiconductor device of claim 11, wherein the second insulating layer extends over the surface of the semiconductor layer.

17. The semiconductor device of claim 11, wherein the second insulating layer covers a bottom surface of the first trench.

18. The semiconductor device of claim 11, wherein the first insulating layer covers a bottom surface of the first trench.

19. A semiconductor device, comprising:
a semiconductor layer;
a first trench extending at least partially through the semiconductor layer;
a second trench extending at least partially through the semiconductor layer;
a first column of semiconductor material formed in the semiconductor layer between the first trench and second trench;
a second column of semiconductor material formed in the semiconductor layer between the first trench and second trench;
a first insulating layer formed over a sidewall of the first trench;
a second insulating layer formed on the sidewall of the first trench and over the first insulating layer;
a gate oxide layer formed over a portion of a surface of the semiconductor layer;
a gate nitride layer formed on a portion of the gate oxide layer;
a gate electrode formed on a portion of the gate nitride layer; and
an inter-dielectric oxide layer formed over the gate electrode, wherein the second insulating layer extends over the inter-dielectric oxide layer.

20. The semiconductor device of claim 19, wherein the first insulating layer includes an oxide layer.

21. The semiconductor device of claim 19, wherein the second insulating layer includes a nitride layer.

22. The semiconductor device of claim 19, further comprising an active semiconductor region formed at the surface of the semiconductor layer.

23. The semiconductor device of claim 19, wherein the first insulating layer extends over the surface of the semiconductor layer.

24. The semiconductor device of claim 19, wherein the second insulating layer extends over the surface of the semiconductor layer.

25. The semiconductor device of claim 19, wherein the second insulating layer covers a bottom surface of the first trench.

26. The semiconductor device of claim 19, wherein the first insulating layer covers a bottom surface of the first trench.

27. The semiconductor device of claim 19, wherein the first trench contains a gas or is sealed under vacuum.

28. The semiconductor device of claim 11, wherein the first trench contains a gas or is sealed under vacuum.

* * * * *